United States Patent
Shen

(10) Patent No.: US 9,578,791 B1
(45) Date of Patent: Feb. 21, 2017

(54) INTERNAL FRAME STRUCTURE WITH HEAT ISOLATION EFFECT AND ELECTRONIC APPARATUS WITH THE INTERNAL FRAME STRUCTURE

(71) Applicant: ASIA VITAL COMPONENTS CO., LTD., New Taipei (TW)

(72) Inventor: Ching-Hang Shen, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 0 days.

(21) Appl. No.: 14/828,497

(22) Filed: Aug. 17, 2015

(51) Int. Cl.
  *H05K 7/20* (2006.01)
  *H01L 23/473* (2006.01)

(52) U.S. Cl.
  CPC ............................... *H05K 7/20954* (2013.01)

(58) Field of Classification Search
  CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
  USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 24/458–459; 454/184; 312/236
  See application file for complete search history.

(56) References Cited

U.S. PATENT DOCUMENTS

| | | | | |
|---|---|---|---|---|
| 8,837,139 B2 * | 9/2014 | Qin | ......................... | G06F 1/203 165/80.4 |
| 2003/0128522 A1 * | 7/2003 | Takeda | .................. | H01L 23/345 361/715 |
| 2003/0214783 A1 * | 11/2003 | Narakino | .............. | F28D 1/0308 361/679.53 |
| 2004/0085730 A1 * | 5/2004 | Lo | ........................... | G06F 1/203 361/695 |
| 2004/0240184 A1 * | 12/2004 | Rivera | .................. | H01L 23/427 361/720 |
| 2005/0185377 A1 * | 8/2005 | Gravina | .................... | G06F 1/20 361/679.46 |
| 2006/0096740 A1 * | 5/2006 | Zheng | ................. | F28D 15/0233 165/104.26 |
| 2006/0137859 A1 * | 6/2006 | Lin | ....................... | F28D 15/046 165/104.26 |

(Continued)

FOREIGN PATENT DOCUMENTS

| | | |
|---|---|---|
| CN | 104737634 A | 6/2015 |
| TW | 495712 | 2/2015 |
| TW | 201531197 | 8/2015 |

*Primary Examiner* — Anthony Haughton
*Assistant Examiner* — Razmeen Gafur
(74) *Attorney, Agent, or Firm* — Jackson IPG PLLC; Demian K. Jackson

(57) ABSTRACT

An internal frame structure with heat isolation effect and an electronic apparatus with the internal frame structure. The internal frame is applied to the electronic apparatus. The internal frame includes a main body and a frame unit. The frame unit includes an inner layer, an outer layer and a heat isolation layer positioned between the inner layer and the outer layer. The inner layer is adjacently connected with the main body. The outer layer is positioned on an outermost side of the frame unit. The heat isolation layer serves to isolate the heat of the main body from being transferred to the outer layer of the frame unit.

8 Claims, 5 Drawing Sheets

(56) References Cited

U.S. PATENT DOCUMENTS

| | | | |
|---|---|---|---|
| 2006/0193113 A1* | 8/2006 | Cohen | G06F 1/203 361/679.48 |
| 2006/0227507 A1* | 10/2006 | Jeong | H05K 7/2099 361/700 |
| 2007/0095507 A1* | 5/2007 | Henderson | F28D 15/043 165/104.26 |
| 2007/0256814 A1* | 11/2007 | Moon | H01L 23/427 165/80.4 |
| 2008/0067000 A1* | 3/2008 | Heiland | E04B 1/8218 181/284 |
| 2009/0073654 A1* | 3/2009 | Beam | H05K 7/20418 361/696 |
| 2010/0073864 A1* | 3/2010 | Hwang | G06F 1/203 361/679.47 |
| 2010/0220439 A1* | 9/2010 | Qin | G06F 1/203 361/679.47 |
| 2010/0243214 A1* | 9/2010 | Moon | F28D 15/0233 165/104.26 |
| 2011/0051369 A1* | 3/2011 | Takahara | H05K 7/2099 361/696 |
| 2012/0087090 A1* | 4/2012 | Feng | F28D 15/0233 361/700 |
| 2013/0141870 A1* | 6/2013 | Rothkopf | G06F 1/1626 361/707 |
| 2013/0308265 A1* | 11/2013 | Arnouse | H05K 7/1488 361/679.41 |
| 2013/0308279 A1* | 11/2013 | Kim | H01L 23/373 361/720 |
| 2014/0092554 A1* | 4/2014 | Yamaguchi | G06F 1/203 361/692 |
| 2014/0226284 A1* | 8/2014 | Yamauchi | C23C 24/04 361/722 |
| 2014/0347811 A1* | 11/2014 | Yu | G06F 1/203 361/679.54 |

* cited by examiner

INTERNAL FRAME STRUCTURE WITH HEAT ISOLATION EFFECT AND ELECTRONIC APPARATUS WITH THE INTERNAL FRAME STRUCTURE

BACKGROUND OF THE INVENTION

1. Field of the Invention

The present invention relates generally to a portable electronic apparatus, and more particularly to an internal frame structure with heat isolation effect and an electronic apparatus with the internal frame structure.

2. Description of the Related Art

Recently, the sizes of the intelligent personal electronic apparatuses such as mobile phones, tablets and portable readers have become larger and larger. In contrast, the thicknesses of the intelligent personal electronic apparatuses have become thinner and thinner. As a result, the heat dissipation performance of the electronic apparatus has become poorer and poorer. Most of the heat of the electronic apparatus is generated by the respective functional units in working, such as the central processor, the battery, the power converter and the display screen. (Especially, in the case that the central processor is equipped with a multi-core operation unit to enhance the execution speed, the heat dissipation problem of the terminal equipment will be more serious). When operating, all these units will generate a great amount of heat. Currently, the heat source of the electronic apparatus is generally fixed on an internal frame structure of the electronic apparatus. Therefore, the internal frame will first absorb the heat generated by the respective functional units when executing the functions. As a result, after the electronic apparatus is turned on to operate, the temperature of the internal frame will rise abruptly and the main body and the periphery of the internal frame will have an extremely high temperature. The existent electronic apparatus often has a larger size, (for example, the mainstream touch mobile phone often has a size of over five inches). Therefore, when a user holds the electronic apparatus with his/her hand, the user can hardly fully hold the electronic apparatus and can simply grasp the electronic apparatus with fingers. The contact point or position where the user grasps the electronic apparatus is often positioned on the outer periphery of the internal frame or the two longer sides of the electronic apparatus. Therefore, in the case that the high heat is transferred to the outer periphery of the internal frame, the user can hardly comfortably hold the electronic apparatus. This will bother the user and lead to inconvenience in use of the electronic apparatus.

SUMMARY OF THE INVENTION

It is therefore a primary object of the present invention to provide an internal frame structure with heat isolation effect. The internal frame structure includes a heat isolation layer for isolating the heat from being transferred to the outer layer of the frame unit of the internal frame.

It is a further object of the present invention to provide the above internal frame structure, which is applied to an electronic apparatus to isolate the heat generated by the internal electronic components of the electronic apparatus from being transferred to the periphery of the electronic apparatus.

To achieve the above and other objects, the internal frame structure with heat isolation effect of the present invention includes a main body and a frame unit. The frame unit includes an inner layer, an outer layer and a heat isolation layer positioned between the inner layer and the outer layer. The inner layer is adjacently connected with the main body. The outer layer is positioned on an outermost side of the frame unit.

The electronic apparatus with the internal frame structure of the present invention includes: a display module having a front face; a front case connected with the display module, the front case being formed with a window, the front face of the display module showing through the window; and an internal frame connected with the front case. The internal frame includes a main body and a frame unit. The frame unit includes an inner layer, an outer layer and a heat isolation layer positioned between the inner layer and the outer layer. The inner layer is adjacently connected with the main body. The outer layer is positioned on an outermost side of the frame unit. Multiple internal electronic components of the electronic apparatus are disposed on the main body.

In the above electronic apparatus, the internal frame is connected with a back case or directly integrally formed with a back case.

In the above electronic apparatus, the main body and the inner and outer layers of the frame unit are made of metal material or nonmetal material and the heat isolation layer of the frame unit is made of thermal insulation material.

In the above electronic apparatus, the main body is a flat-plate heat pipe or heat spreader or vapor chamber. The main body has an internal closed chamber. A capillary structure and a working fluid are disposed in the closed chamber.

In the above electronic apparatus, the display module is a touch display module and the front face of the display module is a touch display face.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

The present invention relates to an internal frame structure with heat isolation effect. The internal frame structure includes a main body and a frame unit disposed on at least two opposite sides or four sides of the main body. The frame unit includes an inner layer, an outer layer and a heat isolation layer positioned between the inner layer and the outer layer. The inner layer is adjacently connected with the main body. The outer layer is positioned on the outermost side of the frame unit.

Figure 1:
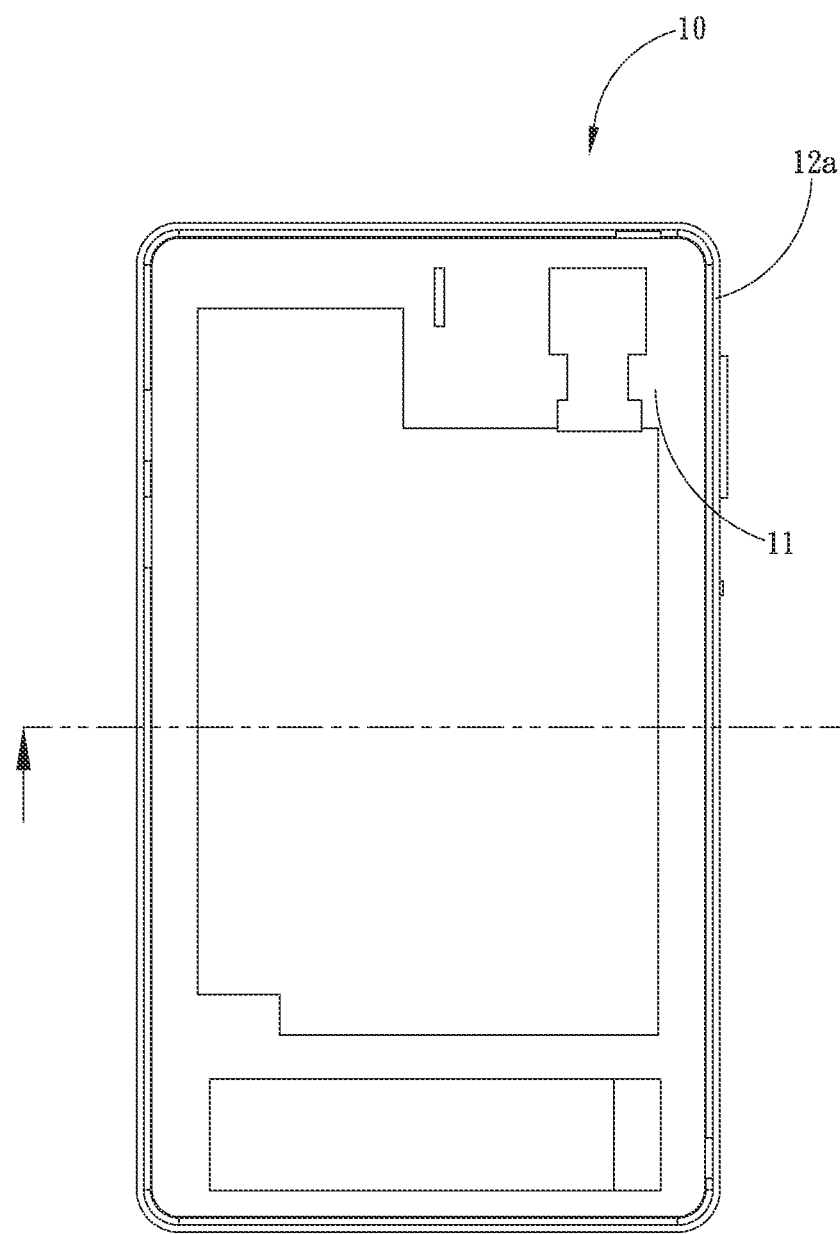
FIG. 1 is a plane view of the internal frame structure of the present invention.
Figure 2A:
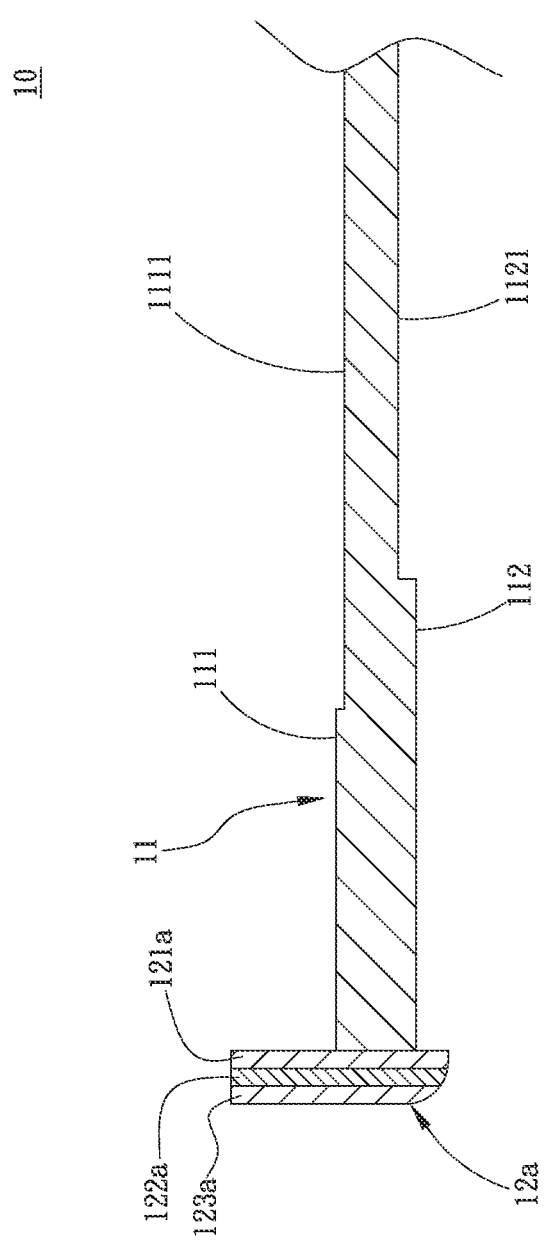
FIG. 2A is a sectional view of a part of the internal frame structure of the present invention.
Figure 2B:
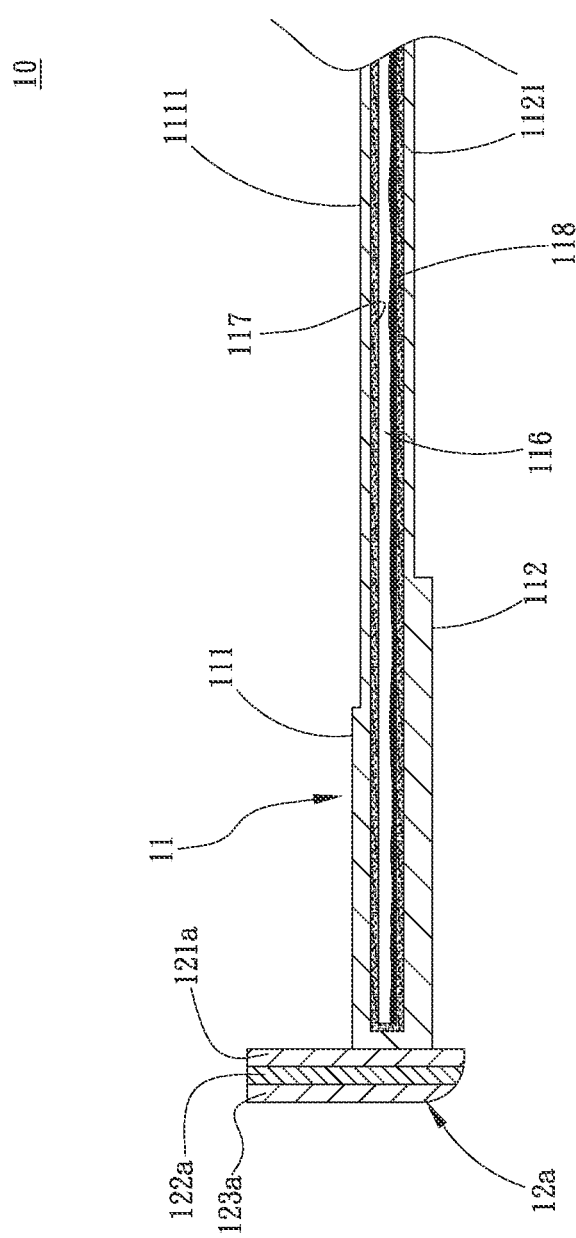
FIG. 2B is a sectional view of a part of another embodiment of the internal frame structure of the present invention.

Please refer to FIGS. 1, 2A and 2B. FIG. 1 is a plane view of the internal frame structure of the present invention. FIG.

2A is a sectional view of a part of the internal frame structure of the present invention. FIG. 2B is a sectional view of a part of another embodiment of the internal frame structure of the present invention. As shown in the drawings, the internal frame 10 is applied to an electronic apparatus for supporting and protecting various components in the electronic apparatus and enhancing the structural strength of the electronic apparatus. When the electronic apparatus is compressed or forced, the internal frame 10 serves to directly protect the electronic apparatus. The internal frame 10 is at least partially made of metal. Alternatively, the internal frame 10 can be entirely made of metal material. The metal material has better strength so that the internal frame 10 has better strength as a whole. The metal material is such as stainless steel, aluminum, aluminum-magnesium alloy, aluminum-titanium alloy, etc.

The internal frame 10 includes a main body 11 and a frame unit 12a. The frame unit 12a is disposed on at least two opposite sides of the main body 11. In this embodiment, the frame unit 12a is disposed on four sides of the main body 11. The frame unit 12a includes an inner layer 121a, an outer layer 123a and a heat isolation layer 122a sandwiched between the inner layer 121a and the outer layer 123a to isolate the inner layer 121a from contacting the outer layer 123a. The inner layer 121a is adjacently connected with the periphery of the main body 11. The outer layer 123a is positioned on the outermost side of the frame unit 12a.

The main body 11 has a first surface 111 and a second surface 112. The first and second surfaces 111, 112 are respectively formed with multiple connection structures such as recesses, perforations, latch plates, posts or an assembly thereof. In this embodiment, the connection structures are recesses 1111, 1121. Multiple internal electronic components of the electronic apparatus are mounted on the first surface 111 and/or the second surface 112 of the main body 11 via the connection structures.

In a preferred embodiment, the main body 11 and the inner and outer layers of the frame unit 12 are respectively made of metal material and/or nonmetal material.

As shown in FIG. 2B, in another embodiment, the main body 11 is a flat-plate heat pipe or heat spreader or vapor chamber. The main body 11 has an internal closed chamber 116. A capillary structure 117 and a working fluid 118 are disposed in the closed chamber 116. Vapor-liquid circulation of the working fluid 118 takes place in the closed chamber 111 to uniformly spread the heat over the main body 11.

In practice, the heat isolation layer 122a is made of thermal insulation material. The thermal insulation material is also referred to as heat insulation material. The thermal insulation material is such as polyurethane foam body, fiber glass, asbestos, ethylene propylene rubber (EPDM) or aromatic polyamide fiber. Preferably, the heat isolation layer 122a is composed of ethylene propylene rubber (EPDM) and aromatic polyamide fiber or ethylene propylene rubber (EPDM) and asbestos. The heat isolation layer 122a is made of the thermal insulation material so that the heat generated by the internal electronic components and absorbed by the main body 11 will not be transferred to the frame unit 12a.

Figure 3:
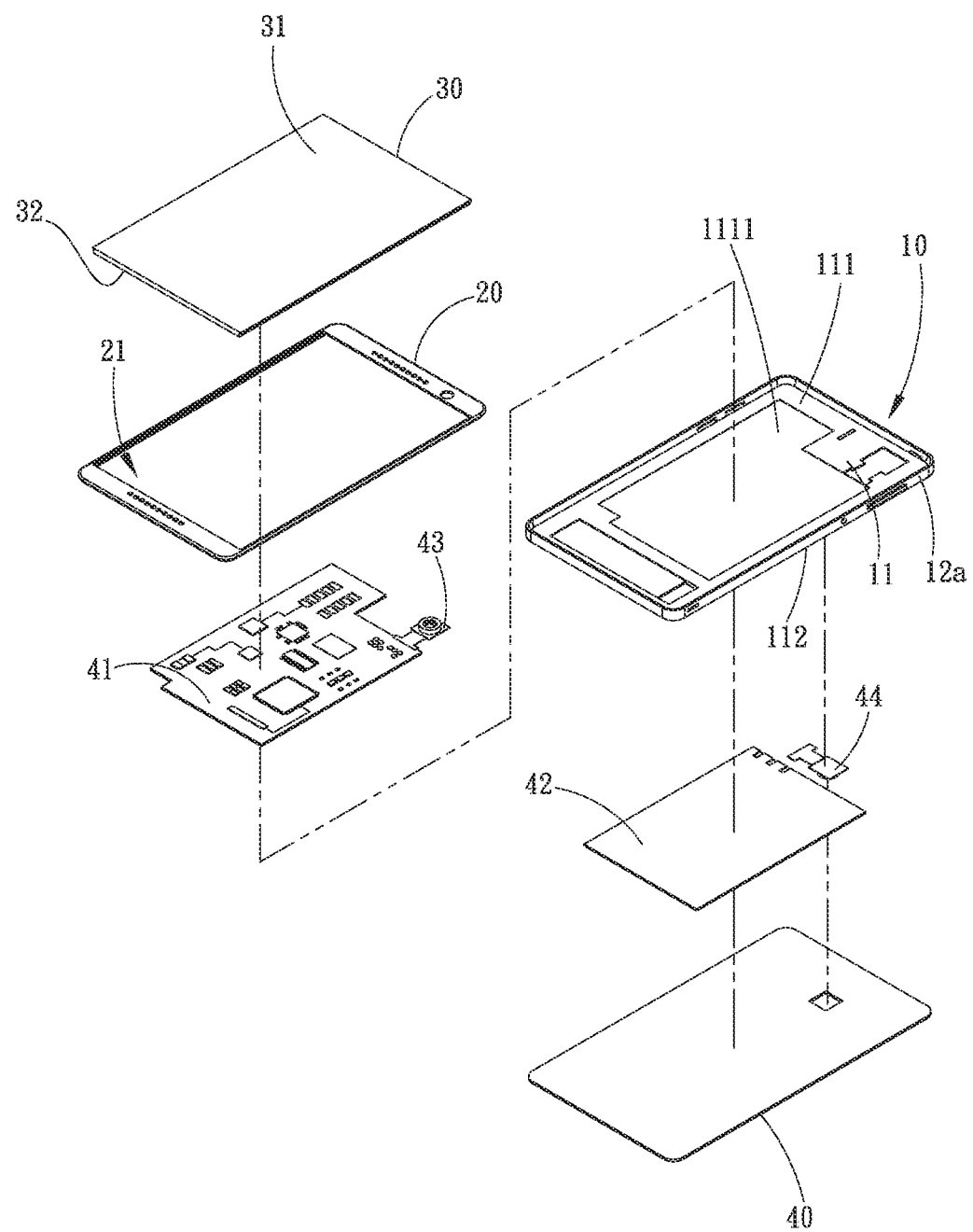
FIG. 3 is a perspective exploded view showing that the internal frame structure of the present invention is applied to an electronic apparatus.
Figure 4:
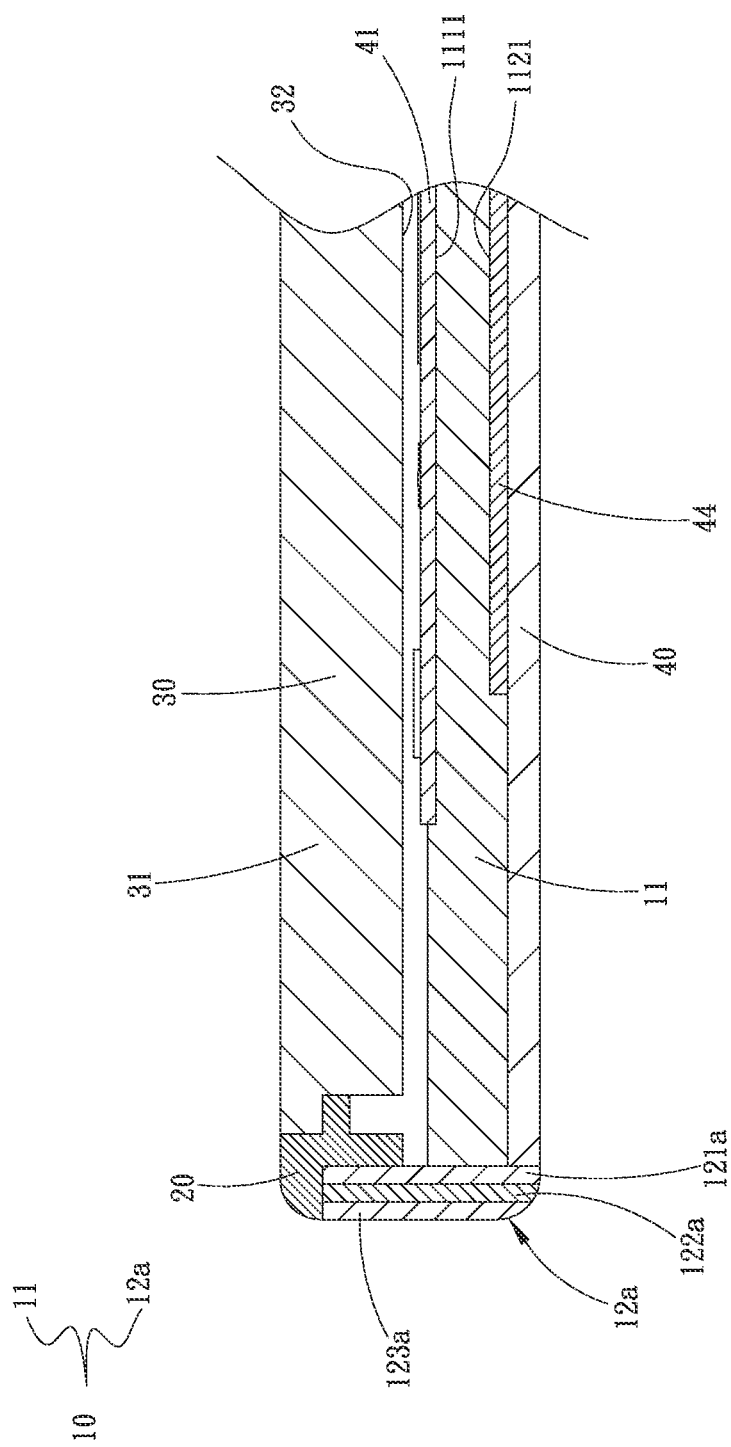
FIG. 4 is a sectional assembled view showing that the internal frame structure of the present invention is applied to the electronic apparatus.

The following is an example for illustrating the practical application of the internal frame:

Please refer to FIGS. 3 and 4. FIG. 3 is a perspective exploded view showing that the internal frame structure of the present invention is applied to an electronic apparatus. FIG. 4 is a sectional assembled view showing that the internal frame structure of the present invention is applied to the electronic apparatus. The electronic apparatus includes an internal frame 10, a front case 20 and a display module 30.

As shown in FIGS. 1, 2A, 2B and 3, the internal frame 10 includes a main body 11 and a frame unit 12a disposed along the periphery of the main body 11. The frame unit 12a includes an inner layer 121a, an outer layer 123a and a heat isolation layer 122a positioned between the inner layer 121a and the outer layer 123a. The inner layer 121a is adjacently connected with the periphery of the main body 11. The outer layer 123a is positioned on the outermost side of the frame unit 12a. The internal frame 10 is connected with the front case 20. As shown in the drawings, the front case 20 is positioned on the first surface 111 of the internal frame 10. A receiving space (not shown) is defined between the front case 20 and the internal frame 10. The front case 20 is formed with a window 21.

The display module 30 is fixedly disposed in the receiving space. The display module 30 includes a front face 31 and a back face 32 opposite to the front face 31. The front face 31 is a display section of the display module 30. As shown in FIG. 3, after the display module 30 is mounted in the receiving space, the front face 31 of the display module 30 shows through the window 21. The display module 30 can be a liquid crystal display (LCD) or a touch display or any other substitutive component. In the case that the display module 30 is a touch display panel, the front face 31 not only serves to display images, but also serves as a touch face for touch operation.

The internal frame 10 is further connected with a back case 40. As shown in the drawings, the back case 40 is positioned on the second surface 112 of the internal frame 10. The front case 20 and the back case 40 together define the configuration of the entire electronic apparatus. The outer layer 123a of the frame unit 12a of the internal frame 10 forms at least two opposite sides or four sides of the electronic apparatus and is exposed to external environment as a holding section for a user's hand to hold.

Multiple internal electronic components of the electronic apparatus are disposed on the main body 11 of the internal frame 10. The internal electronic components include a motherboard 41, a battery 42, a front lens module 43 and a rear lens module 44. Various components including processors, power chips and audio/video chips are arranged on the motherboard 41. As shown in the drawings, in this embodiment, the motherboard 41 and the battery 42 are respectively disposed in the recesses 1111, 1121 of the first and second surfaces 111, 112 of the main body 11 of the internal frame 10. The display module 30 and the battery 42 and the front and back lens modules 43, 44 are electrically connected to the motherboard 41. In another embodiment, the back case 40 is integrally formed with the internal frame 10 and the multiple electronic components are disposed on the first surface 111 of the main body 11 of the internal frame 10.

In operation of the electronic apparatus, the internal electronic components such as the motherboard 41 and the battery 42 and the front and back lens modules 43, 44 (as shown in FIG. 3) will generate heat. The heat is transferred to the main body 11 of the internal frame 10. As aforesaid, the heat isolation layer 122a of the frame unit 12a is positioned between the inner layer 121a and the outer layer 123a so that the heat of the main body 11 is isolated from being transferred to the outer layer 123a of the frame unit 12a. In this case, the heat generated by the internal electronic components is only spread over the main body 11 of the internal frame 10 and cannot be transferred to the outer layer 123a of the frame unit 12a. Under such circumstance, the outer layer 123a serving as at least two opposite sides or four sides of the electronic apparatus can be comfortably held by a user's hand without scalding the user's hand or causing bothering inconvenience in use of the electronic apparatus.

In practice, the electronic apparatus can be, but not limited to, a mobile phone or a tablet for illustration purposes only. It should be well known by those who are skilled in this field that the present invention is also applicable to other types of electronic apparatuses.

According to the above arrangement, the present invention at least has the following advantage:

The heat isolation layer 122a is positioned between the inner layer 121a and the outer layer 123a of the frame unit 12a of the internal frame 10 to isolate the heat of the main body 11 from being transferred to the outer layer 123a of the frame unit 12a. The outer layer 123a of the frame unit 12a forms at least two opposite sides or four sides of the electronic apparatus and is exposed to external environment. The two opposite sides (such as, but not limited to, two long sides) serve as a holding section for a user's hand to hold. Therefore, the user's hand can comfortably hold the electronic apparatus.

The present invention has been described with the above embodiments thereof and it is understood that many changes and modifications in the above embodiments can be carried out without departing from the scope and the spirit of the invention that is intended to be limited only by the appended claims.

What is claimed is:

1. A mid-frame structure with heat isolation effect as applied to a handheld electronic apparatus, comprising a planar main body and a frame unit extending along at least two opposed edges of a periphery of the main body, the frame unit including an inner layer, an outer layer and a heat isolation layer sandwiched in-between the inner layer and the outer layer, wherein the inner layer is positioned on an innermost side of the frame unit and adjacently connected with the main body, the outer layer being positioned on an outermost side of the frame unit.

2. The mid-frame structure with heat isolation effect as claimed in claim 1, wherein the main body and the inner and outer layers of the frame unit are made of metal material or nonmetal material and the heat isolation layer of the frame unit is made of thermal insulation material.

3. The mid-frame structure with heat isolation effect as claimed in claim 1, wherein the main body is a flat-plate heat pipe or heat spreader or vapor chamber, the main body having an internal closed chamber, a capillary structure and a working fluid being disposed in the closed chamber.

4. A handheld electronic apparatus comprising:
a display module having a front face;
a front case connected with the display module, the front case being formed with a window, the front face of the display module showing through the window; and
a mid-frame connected with the front case, the mid-frame including a planar main body and a frame unit extending along at least two opposed edges of a periphery of the main body, the frame unit including an inner layer, an outer layer and a heat isolation layer sandwiched in-between the inner layer and the outer layer, wherein the inner layer is positioned on an innermost side of the frame unit and adjacently connected with the main body, the outer layer being positioned on an outermost side of the frame unit, multiple internal electronic components of the electronic apparatus being disposed on the main body.

5. The handheld electronic apparatus as claimed in claim 4, wherein the internal frame is connected with a back case or formed with a back case.

6. The handheld electronic apparatus as claimed in claim 4, wherein the main body and the inner and outer layers of the frame unit are made of metal material or nonmetal material and the heat isolation layer of the frame unit is made of thermal insulation material.

7. The handheld electronic apparatus as claimed in claim 4, wherein the main body is a flat-plate heat pipe or heat spreader or vapor chamber, the main body having an internal closed chamber, a capillary structure and a working fluid being disposed in the closed chamber.

8. The handheld electronic apparatus as claimed in claim 4, wherein the display module is a touch display module and the front face of the display module is a touch display face.

* * * * *